United States Patent [19]

Ronen

[11] 4,422,087
[45] Dec. 20, 1983

[54] SELF-ALIGNED SHORT CHANNEL MESFET

[75] Inventor: Ram S. Ronen, Placentia, Calif.

[73] Assignee: Xerox Corporation, Stamford, Conn.

[21] Appl. No.: 155,995

[22] Filed: Jun. 3, 1980

[51] Int. Cl.³ .......................................... H01L 29/48
[52] U.S. Cl. ...................................... 357/15; 357/22; 357/86
[58] Field of Search .................. 357/15, 22, 86, 22 R, 357/22 S

[56]  References Cited

U.S. PATENT DOCUMENTS

| | | | |
|---|---|---|---|
| 4,077,111 | 3/1978 | Driver et al. | 357/15 |
| 4,111,725 | 9/1978 | Cho et al. | 357/15 |
| 4,160,984 | 7/1979 | Ladd et al. | 357/22 |

Primary Examiner—James W. Davie

[57] ABSTRACT

A MESFET with a relatively short channel and small source-to-gate and drain-to-gate spacing for minimal series resistance and maximum frequency response having no alignments or critical steps. In particular, a mask is used to define schottky metal as ohmic metal from the source/drain areas across a relatively undoped bare substrate to within a predetermined distance L of the schottky gate wherein the predetermined distance is a non-critical electrical short-circuit as to the surface of the bare substrate. Thus the source-to-gate and drain-to-gate distances are non-critical because the predetermined distance L can be as critically controlled as the single mask that defines it.

2 Claims, 7 Drawing Figures

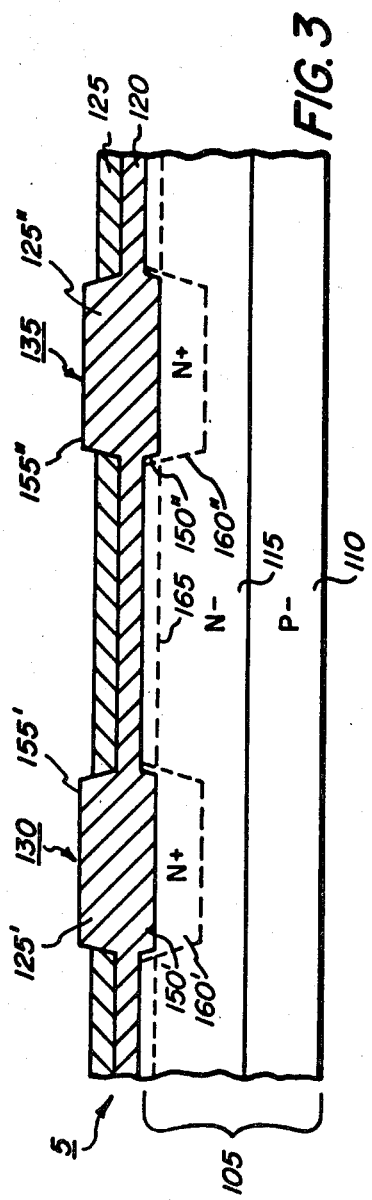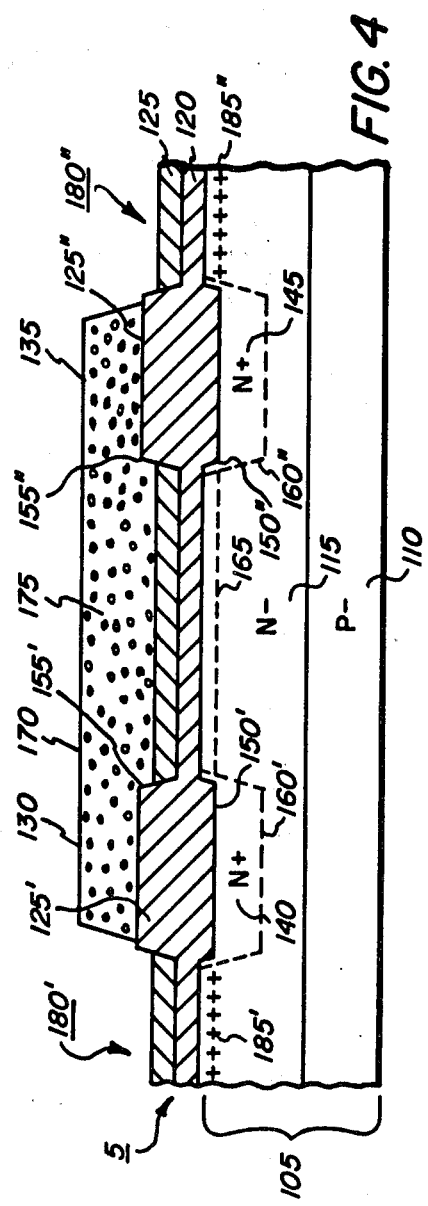

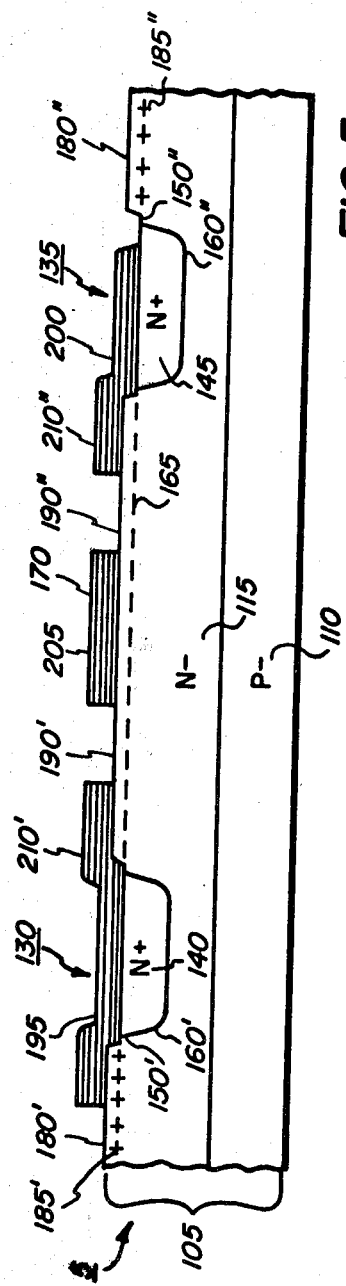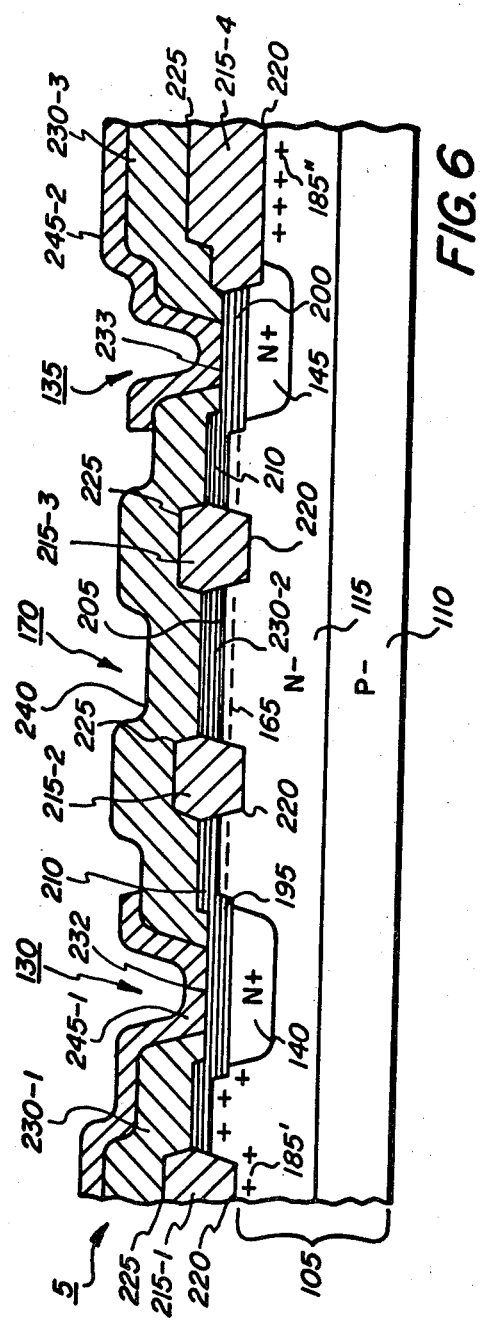

4,422,087

SELF-ALIGNED SHORT CHANNEL MESFET

BACKGROUND OF THE INVENTION

A. Field of the Invention

This invention relates to MESFET devices.

B. Prior Art

In the past, the development of MESFET's has been hindered by process complexities and process difficulties including aligning of the gate, source and drain as to each other when using multiple masks and critical steps when approaching submicron size that have disallowed minimizing the source-to-gate, drain-to-gate, and gate channel spacings and related series resistance to any great degree relative to MOSFET's in regards to what is possible with a photolithographic or E-Beam Process.

SUMMARY OF THE INVENTION

It is an important object of the invention to provide a means for fabricating a short channel MESFET with minimal series resistance using a simple process having no critical alignment steps.

It is another important object of the invention to provide a MESFET wherein the Schottky gate, drain, and source are defined by one mask thus fixing the distance between them with no alignments.

It is a further important object of the invention to provide a MESFET wherein a mask is used to define ohmic contact metal from the source/drain areas across a relatively undoped bare substrate to within a predetermined distance (L) of the Schottky gate wherein the predetermined distance (L) is a non-critical short-circuit relative to the surface of the bare substrate.

It is yet another object of the invention to provide a MESFET wherein the source-to-gate and drain-to-source distances are non-critical because the predetermined distance (L) is critically controlled by the single mask that defines it.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawings in which:

FIG. 3 is a cross-sectional schematic representation of the MESFET of FIG. 1 at a step in the process where the threshold implant has been completed.

FIG. 4 is a cross-sectional schematic representation of the MESFET of FIG. 1 at a step in the process where the field implant has been completed.

FIG. 5 is a cross-sectional schematic representation of the MESFET of FIG. 1 at a step in the process where the definition and etch of the Schottky metal has been completed.

FIG. 6 is a cross-sectional schematic representation of the MESFET of FIG. 1 at a step in the process where re-metalization of open contacts has been completed.

DETAILED DESCRIPTION OF THE PREFERRED EMBODIMENT

Referring particularly to FIGS. 1 through 7 of the drawings by the characters of reference, there is illustrated a MESFET for carrying out the objects of the invention.

Figure 1:
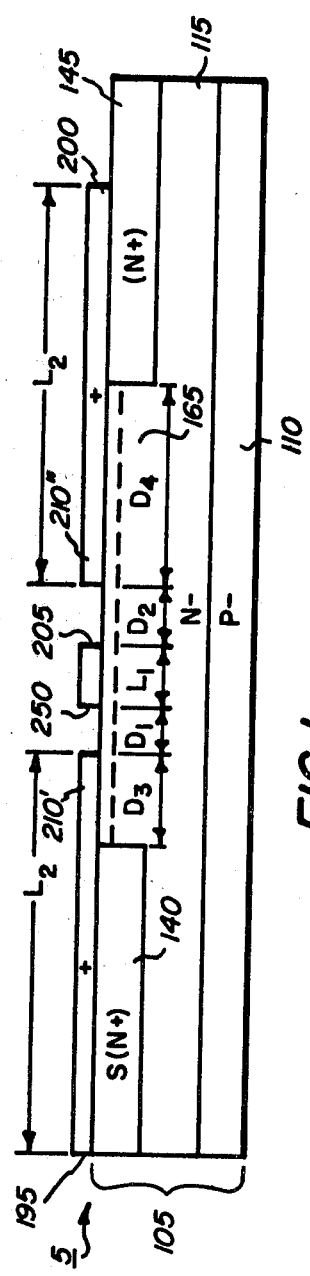
FIG. 1 is a cross-sectional block view of the completed MESFET showing how the spatial orientations of the ohmic contacts (L2) may be offset relative to the source/drain areas without affecting the relative relationships of D1 and D2 to L1.

The self-aligned short-channel metal semiconductor field effect transistor (MESFET) 5, as shown in FIG. 1, is operative to have a substrate 105 with a p− doped layer 110 and disposed thereabove an n− doped layer 115. Note that the substrate 105 may be p− doped only. Implanted in the n− doped layer 115 of the substrate is a source(S) n plus (+) area 140 having a given dosage concentration and a drain (D) N plus (+) area 145 whereby a channel area 165 is provided between source 140 and drain 145. Deposited on the surface of the substrate over areas 140/145 and overlapping into the channel area 165 adjacent to the gate region 170 are metal areas 195/200 which function as ohmic contacts for the source and drain areas 140/145 respectively. In addition, Schottky metal has been deposited in the gate region 170 over a portion of the channel area 176 for functioning as a schottky gate 205 having a schottky barrier at 250. It will be appreciated that insomuch as only one mask is used to define the ohmic drain and source contacts or conducting electrodes 195/200 and schottky gate electrode 205, their spatial relation as to each other is relatively fixed. In this embodiment submicron distance D1 equals D2 equals L1 for a narrow channel area 165, though this need not necessarily be the case. The ohmic contacts or conducting electrodes 195 and 200 may vary in their relative spatial orientation as to source and drain areas 140/145 respectively. Specifically, the portions 210′/210″ of the ohmic contacts 195/200 overlap the channel 165 such that D3 is not ordinarily equal to D4. This is tolerable in that the ohmic contacts 195/200 (acting as conductors) are operative to short-out portions of the surface of the channel area 165 (that is relatively undoped compared to the source/drain areas 140/145) due to the hot metal layers 195/200, when deposited, fusing to the substrate 105; thus the distances D3 and D4 are irrelevant and non-critical since the channel 165 is shorted-out over those distances.

The result of this short-circuiting is to operatively bring the source/drain areas 140/145 effectively to the end of the overlapping portions 210′/210″ adjacent the schottky gate 205. Thus the ends of the portions 210′/210″ act to bound the effective channel area 165 (D1+L1+D2). Accordingly the (D3 plus D1) and the (D2 plus D4) distances can be plus-micro or more than one micron in size while at the same time D1 and D2 are submicron thereby disallowing the need for critical alignments which in turn allows for preventing possible short-circuiting as between the schottky gate 205 and source/drain areas 140/145 due to the relatively large spatial dimension between these two points. In summary, in the above relatively simple process, there are no critical steps because one can work in the plus-micron range, in regards to the short-circuited overlapping ohmic contact portions 210′/210″, and there are no alignment problems insomuch as only one mask for self-aligning need be used to define or fix the spatial orientation of the schottky gate 205 to source/drain areas 140/145. It will be appreciated that in view of the above, dimensions of the submicron source-to-gate/-drain-to-gate lengths 190'/190" only limited by the photolithographic or E-beam process itself and thus the process can be reliably used to form devices down to the submicron or VLSI range. By limiting the lengths of the spacings 190'/190" and the schottky gate 205, the effective channel area may be relatively very narrow and thus the series resistance is very strictly minimized while the frequency (gain) response is maximized. The series resistance is measured from the edge of the overlapping and extended portion 210'/210" closest to the schottky gate 205 to the edge of the schottky gate 205 itself.

Figure 2:
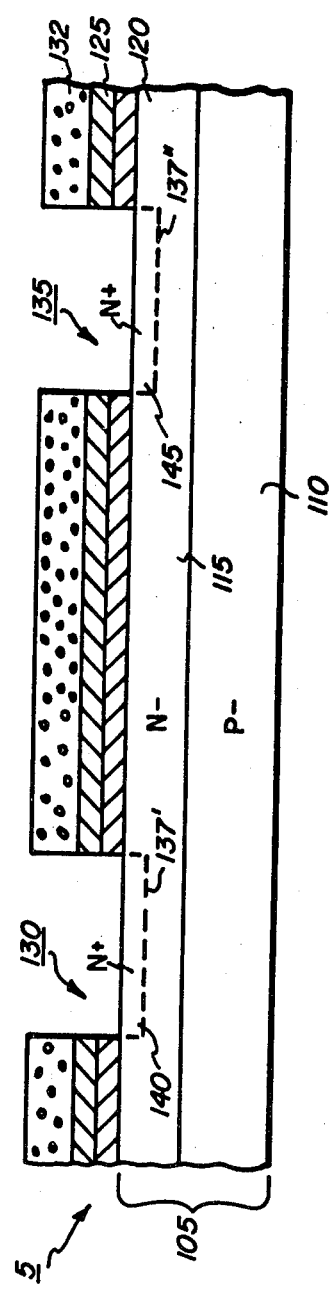
FIG. 2 is a cross-sectional schematic representation of the MESFET of FIG. 1 at a step in the process where implants into the etched openings have been completed.
Figure 7:
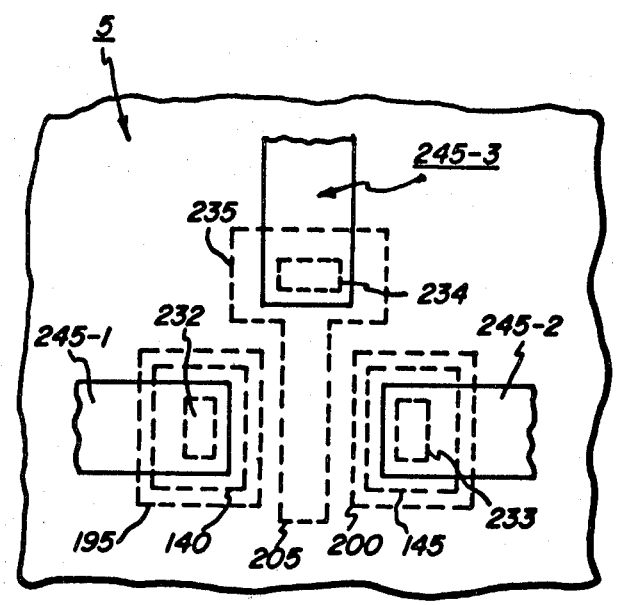
FIG. 7 is an overhead schematic representation of the Schottky gate and its associated ohmic contact of the MESFET of FIG. 1.

As a first major step in the process for creating a MESFET 5 having multiple substeps as shown in FIG. 2, a silicon substrate 105 is p minus (−) doped as a layer 110 and n minus (−) doped relatively near the surface as a layer 115. A thin oxide layer is grown on the surface of the substrate 105 as silicon dioxide (SiO2) layer 120. A thin layer 125 of Silicon Nitride (Si3N4) is deposited on the surface of the SiO2 layer 120. A photolithographic subprocess including substeps of depositing a layer 132 of photoresist, masking and exposing selected areas with ultraviolet UV light and etching away the exposed areas as openings down to the surface of the substrate 105 with an acid bath thereby defining source and drain regions 130, 135 respectively. Next, the exposed source and drain regions 130, 135 are implanted or otherwise doped to be n+ to a predetermined depth 137 and concentration thereby creating source and drain (n plus) areas 140, 145 respectively.

As a second major step in the MESFET process having multiple substeps, as shown in FIG. 3, the photoresist layer 132 is stripped. A hot oxygen containing gas is applied to oxidize the exposed source and drain regions 130, 135 thereby reforming a SiO2 layer 120' and 120" to a depth slightly below 150' and 150" the surface of the substrate 105 and to a height slightly above 155' and 155" the surface of the Si3N4 layer 125. It will be appreciated that the Si3N4 layer 125 will not appreciably react with the hot oxygen containing gas. Next, a drive implant is accomplished by heating the source and drain regions 130/135 in a furnace to activate them and drive the source and drain areas 140/145 even deeper to a depth 160'/160". Finally, a thermal implant is made by shooting ions through the Si3N4 layer 125 and the SiO2 layers 120, 125' and 125" to drive them relatively shallowly into the surface of the substrate 105 and heating in a furnace only to the extent of activating, but not driving the affected area 165 any deeper. It will be appreciated that the whole surface of the substrate 105 is uniformely affected, but only the gate region 170 to be is of interest at this point and thus will be arbitrarily designated the affected area or channel area 165. It will be further appreciated that the threshold implant refers to the threshold voltage in the channel area 165 that may be controlled by a gate voltage described infra.

As a third major step in the process for creating a MESFET 5 having multiple substeps, as shown in FIG. 4, a photolithographic subprocess including the substeps of depositing a layer 176 of photoresist, masking and exposing selected areas with UV light, and etching away the exposed areas as openings down to the SiN4 layer 125 with an acid bath thereby defining regions 180' and 180" for subsequent field implantations as described infra. Next, ions are uniformly shot across the surface of the photoresist layer 175 and the exposed field implant regions 180' and 180", but the photoresist layer 175 absorbs the ions whereas the Si3N4 and SiO2 layer 120/125 in the field implant regions 180'/180" transmit them through to the surface of the substrate 105 for relatively shallow implantation therein as field implant areas 185'/185". The field implant areas 185'/185" are relatively p plus and thus operative to provide MESFET inter-device isolation.

As a fourth major step in the process for creating a MESFET 5 having multiple substeps, as shown in FIG. 5, strip the photoresist layer 175 through the use of an acid bath or organic solvent or plasma stripping. The field implant areas 185'/185" are driven by heating in a furnace thereby activating the areas 185'/185" and extending the depths thereof to a predetermined level. The Si3N4 layer 125 is uniformly etched away via an acid bath. The SiO2 layer 120 is uniformly stripped away also via an acid bath. The exposed surface of the substrate 105 is then uniformly sputter deposited or evaporated with a metalizing layer of predetermined depth of tungsten (W) or molybdenum (Mo), or other suitable materials. Finally, a photolithographic subprocess including the substeps of depositing a layer (not shown) of photoresist, masking and exposing selected areas with UV light, and etching away the exposed areas as opening down to the surface of the substrate 105 with an acid bath thereby defining regions 190'/190" from source-to-gate and drain-to-gate respectively and conversely the ohmic contacts 195, 200, and schottky gate 205 for source, drain and gate respectively. It will be appreciated that the metalizing layer used for the ohmic contacts 195, 200 is schottky metal and in fact is only needed for the schottky gate 205, but on the other hand schottky metal performs more than adequately as an ohmic contact. Accordingly, the ohmic contacts 195, 200 and schottky gate 205 can all be laid down with one mask thereby eliminating alignment and critical step problems. Specifically, the portions 210', 210" of the ohmic contact 195, 200 from the source and drain nearest the schottky gate 205 are allowed to overlap and extend onto the bare silicon substrate 105 in such a manner that the ohmic contacts 195, 200 and schottky gate 205 keep their relative spatial orientation as to each other insomuch as they are all laid down by one and the same mask even though they may all slightly shift uniformly in one direction when being laid down or defined by the mask. It will be further appreciated that the portions 210'/210" of the ohmic contacts 195/200 that are in contact with the bare silicon of the substrate 105 act to short-circuit the surface of the substrate (due to the metal layer 195/200 when deposited fusing as a metallic electrically conductive layer to the substrate 105) from the portion 210'/210" nearest the source/drain area 140/145 to the portion 210'/210" nearest the source-to-gate/drain-to-gate regions 190'/190" thus making the portions 210'/210" length relatively noncritical. The result of this short-circuiting is to operatively electrically bring the source/drain areas 195/200 effectively to the end of the overlapping portion 210'/210" adjacent the schottky gate 205. Thus the ends of the portions 210'/210" act to bound the effective channel area 165 (D1+L1+D2). It further means that the souce-to-gate and drain-to-gate regions 190'/190" and schottky gate 205 can relatively easily be made at submicron lengths in a production mode at a relatively high success rate without worrying about shorting-out the schottky gate 205 to the source or drain areas 140/145 insomuch as it is self-aligned and self-registered.

As a fifth major step in the process for creating a MESFET 5 having multiple substeps, as shown in FIG. 6, SiO2 areas 215-1, 215-2, 215-3, 215-4 are thermally grown as thermal oxide in the field implant regions 180'/180" and the source-to-gate and drain-to-gate regions 190'/190". Note that the SiO2 areas 215 - (1-4) are grown into substrate 105 at a level 220 and above the ohmic contacts 195/200 at a level 225. Oxide is then deposited uniformly over the thermal oxide areas 215 - (1-4), the ohmic contacts 195/200 and schottky gate 205 for passivation. Next, a photolithographic subprocess including the substeps of depositing a layer (not shown) of photoresist, masking and exposing selected area with UV light, and etching away the exposed areas with an acid bath as openings down to the ohmic contacts 195/200 of the source and drain areas 140/145 thereby defining or opening up contacts at 232 and 233. It will be appreciated that the schottky gate 205, as shown in cross-sectional view in FIG. 6 and top view in FIG. 7, has been brought out as an ohmic contact to an oversized pad area 235 where a contact 234 may be opened up. It will be further appreciated that the above is done to insure an ohmic contact 234, for the schottky gate 205 that is submicron in cross-section made by bringing out an oversized pad area 235 functioning as an ohmic contact that is plus micron in cross-sectional size. Finally, a metalizing layer of aluminum is uniformably deposited over the deposited oxide 230 - (1-3) and exposed ohmic contacts 232-4. Then a photolithographic subprocess including the substeps of depositing a layer (not shown) of photoresist, masking and exposing selected areas with UV light, and etching away the exposed area 240 as openings down to the surface of the deposited oxide 230. The remaining metal of the aluminum (Al) metalizing layer comprises source electrode 245-1, drain electrode 245-2 and gate electrode 245-3. It will be further appreciated that the given embodiment could be reverse doped substitute p for n and n for p without affecting the quality of the invention. It will also be further appreciated that plus-micron means greater than micron size whereas submicron means less than micron size.

Among the advantages of the process is the simplicity thereof due to the use of a simple mask for aligning source/drain areas 140/145 to the schottky gate 205. In the exemplified embodiment n minus (−) metal schottky (W or Mo) 205 is used in regards to the n (−) layer 115 of the substrate 105, but p (−) metal is equally adaptable in regards to the substrate 105 with the proper choice of metal as to the schottky gate 205. It will be also appreciated that implants in the substrate 105 such as the source/drain areas 140/145 can be added to or subtracted from to adjust field and improve ohmic contacts, among other features. The embodied structure of the MESFET 5 has a grounded (not shown) (N−) substrate 105 through a short-circuit contact at source area 140 interface (n+/N5) (not shown). By etching through the (n−) layer 115 to the (p−) substrate 110, the entire MESFET chip 5 could be grounded (not shown). It will be further appreciated that if a nonrefractory metal is used such as platnium (Pt) or Paladium (Pd), it will form an excellent schottky barrier 250 at the surface of the (n−) layer 115 and an excellent ohmic contact 195/200 at the (n+) source/drain areas 140/145. The thermal oxidation layer 215 - (1-3) step is not absolutely necessary in that the deposited oxide layer 230 - (1-3) step could be adequately used in lieu of. It will also be appreciated that the (n−) layer 115 can be obtained by implantation, as described, or epitaxy (not described). An alternative process might include a shallow (n+) implant at source area 140 and/or drain area 145 to significantly improve ohmic contacts 195/200 and minimize series resistance.

While the above referenced embodiment of the invention has been described in considerable detail with respect to the MESFET, it will be appreciated that other modifications and variations therein may be made by those skilled in the art without departing from the true spirit and scope of the invention.

What is claimed:
1. A solid state MESFET device including:
a substrate layer;
a source region, of a given doping concentration, formed in said substrate and having an outer surface extending along a surface of said substrate layer;
a drain region, of a given doping concentration, formed in said substrate and having an outer surface extending along said surface of said substrate layer;
the portion of said substrate layer extending from said source region to said drain region along said surface providing a channel region having an outer surface, said channel region having a doping concentration less than the doping concentrations of said source region and said drain region;
the outer surfaces of said source region, said drain region and said channel region lying in a common plane;
a Schottky gate contact to said channel region;
a metallic drain contact contacting at least a portion of said outer surface of said drain region and a portion of said outer surface of said channel;
a metallic source contact contacting at least a portion of the outer surface of said source region and a portion of said outer surface of said channel;
said portions of the outer surface of said channel region in contact with said metallic contacts being short-circuited by such metallic contacts whereby the effective length of said channel region is determined by the distance between said metallic contacts.

2. A solid state MESFET device including:
a substrate layer;
a source region, of a given doping concentration, formed in said substrate and having an outer surface extending along a surface of said substrate layer;
a drain region, of a given doping concentration, formed in said substrate and having an outer surface extending along said surface of said substrate layer;
the portion of said substrate layer extending from said source region to said drain region along said surface providing a channel region having an outer surface, said channel region having a doping concentration less than the doping concentrations of said source region and said drain region;
the outer surfaces of said source region, said drain region and said channel region lying in a common plane;
a Schottky gate contact to said channel region;
a metallic drain contact having a first portion contacting at least a portion of said outer surface of said drain region and an extended portion contacting a portion of said outer surface of said channel region whereby the drain region is short-circuited to the end of said extended drain contact portion such that the effective drain/gate length is measured from the gate contact to said end of said extended drain contact portion nearest the gate contact; and a metallic source contact having a first portion contacting at least a portion of said outer surface of said source region and an extended portion contacting a portion of said outer surface of said channel region whereby the source region is short-circuited to the end of said extended source contact portion such that the effective source/gate length is measured from the gate contact to the end of the extended source contact portion nearest the gate contact.

* * * * *